(12) United States Patent
Petenyi et al.

(10) Patent No.: US 12,695,291 B2
(45) Date of Patent: Jul. 28, 2026

(54) ANALOG STATUS SIGNALIZATION AND SYNCHRONIZATION BETWEEN INTEGRATED CIRCUITS

(71) Applicant: STMicroelectronics International N.V., Geneva (CH)

(72) Inventors: Sandor Petenyi, Lysa nad Labem (CZ); Lukas Machacek, Prague (CZ); Salvatore D'Angelo, San Pietro Clarenza (IT)

(73) Assignee: STMicroelectronics International N.V., Geneva (CH)

( * ) Notice: Subject to any disclaimer, the term of this patent is extended or adjusted under 35 U.S.C. 154(b) by 369 days.

(21) Appl. No.: 18/242,621

(22) Filed: Sep. 6, 2023

(65) Prior Publication Data

US 2025/0079824 A1 Mar. 6, 2025

(51) Int. Cl.
H02H 3/20 (2006.01)
G01R 31/74 (2020.01)
(52) U.S. Cl.
CPC ............... H02H 3/20 (2013.01); G01R 31/74 (2020.01)
(58) Field of Classification Search
CPC ....... H02H 3/20; G01R 31/74; G01R 19/0084
USPC ......................................................... 361/91.1
See application file for complete search history.

(56) References Cited

U.S. PATENT DOCUMENTS

| | | | |
|---|---|---|---|
| 9,671,465 B2 | 6/2017 | Simonson et al. | |
| 10,222,814 B1 | 3/2019 | Chakraborty et al. | |
| 10,855,275 B2 * | 12/2020 | Garg | H03K 17/6871 |
| 11,264,983 B1 | 3/2022 | Kaya et al. | |
| 11,283,392 B2 | 3/2022 | Baurle et al. | |
| 11,614,478 B2 * | 3/2023 | Schemm | H03K 17/0822 |
| | | | 324/762.09 |
| 12,553,940 B2 * | 2/2026 | Petenyi | G01R 31/2884 |
| 2003/0117829 A1 * | 6/2003 | Ronza | G11C 7/1045 |
| | | | 365/96 |
| 2019/0140573 A1 | 5/2019 | Baurle et al. | |
| 2022/0300019 A1 | 9/2022 | Lawange et al. | |
| 2024/0329127 A1 * | 10/2024 | Megaw | G01R 31/2853 |
| 2024/0402241 A1 * | 12/2024 | Petenyi | G01R 27/08 |
| 2025/0219402 A1 * | 7/2025 | Geula | B60R 16/033 |

* cited by examiner

*Primary Examiner* — Dharti H Patel
(74) *Attorney, Agent, or Firm* — Crowe & Dunlevy LLC

(57) ABSTRACT

Disclosed herein is method for fault detection and communication in analog power electronic circuits with a multiplicity of electronic fuses (e.g., a primary fuse and at least one secondary fuse). Current flow is monitored through each fuse. Fault conditions in these electronic fuses are identified. Upon detection, the fault signaling line, which is common to all fuses, is driven to a voltage indicative of the detected fault condition. The primary electronic fuse then latches the voltage on this fault signaling line. A detection and communication circuit enables corrective actions to be performed at the fuse level, dictated by the latched voltage.

13 Claims, 4 Drawing Sheets

ANALOG STATUS SIGNALIZATION AND SYNCHRONIZATION BETWEEN INTEGRATED CIRCUITS

TECHNICAL FIELD

This disclosure is directed to the field of analog power electronic circuits and, in particular, to techniques for communication between multiple parallel connected electronic fuses in an analog power electronic circuit.

BACKGROUND

Electronic fuses are safety devices embedded within analog power electronic circuits, which can encompass a variety of applications such as power supplies, converters, and power amplifiers. For instance, electronic fuses are employed to safeguard systems such as computer servers and telecom peripherals. In these applications, fuses facilitate the hot-plug feature (e.g., capability to insert or remove components from an electronic device while it remains powered on), providing for a safe connection between the supply and load.

An electronic fuse includes a power Metal-Oxide-Semiconductor Field-Effect Transistor (MOSFET), placed within the analog power electronic circuit where it can effectively break the current flow when necessary. Under normal operating conditions, the MOSFET is maintained in an 'on' state, providing for a steady flow of current through the components of the power electronic circuit. However, when the current, as monitored by a current sensor, exceeds a predefined safe threshold or an unexpected voltage surge is detected, the MOSFET is toggled into an 'off' state by a controller. This swift action disrupts the current flow, providing a safeguard for the rest of the components of the power electronic circuit.

The primary device in this context refers to the electronic fuse that has a direct communication link with the digital control component of the system, enabling it to receive and send information to this digital control component of the system. On the other hand, the secondary devices are the remaining electronic fuses in the parallel topology that lack this direct digital communication link, thereby limiting their ability to relay or receive status updates from the digital control component of the system.

This disconnect becomes a problem in topologies where multiple electronic fuses are utilized in parallel. The lack of information exchange decreases the robustness of the topology and makes the secondary devices essentially operate 'blind'.

Consider an event where one of the secondary devices, sensing an abnormal condition, limits the current flowing through its MOSFET or completely switches its MOSFET off. Without direct communication with the rest of the devices, the status change in the affected secondary device is not immediately known by the other devices, including the primary device. This lack of immediate information exchange can lead to overloading of the remaining devices, a situation that may initiate a 'cascading failure', which is a sequence of failures in a system of interconnected parts, wherein the failure of one part can trigger the failure of successive parts—for example, the switch off of the MOS-FET of one secondary device may trigger the switch off of the MOSFETS of other devices. This indirect information exchange further complicates fault detection, as the real root cause may be obscured or masked, leading to potential system instability or failure.

Therefore, there is a pressing need for a solution that not only enhances the robustness of power electronic circuits with parallel electronic fuse topology but also improves the direct communication between electronic fuses, providing for effective fault detection and proactive fault management.

SUMMARY

Disclosed herein is a method of fault detection and communication in an analog power electronic circuit having a plurality of electronic fuses, the plurality of electronic fuses including a single primary fuse and at least one secondary fuse. The method includes: monitoring current through each of the plurality of electronic fuses; detecting a fault condition within at least one of the plurality of electronic fuses; driving a fault signaling line common to each of the plurality of electronic fuses to a voltage corresponding to the detected fault condition; latching a voltage on the fault signaling line using the primary electronic fuse; performing corrective action at the plurality of electronic fuses based upon the latched voltage; and releasing the latching of the voltage.

Driving the fault signaling line to the voltage corresponding to the detected fault condition may be performed by: at each of the plurality of electronic fuses, sourcing a constant current to a feedback node coupled to the fault signaling line; and at the electronic fuse experiencing the fault condition, sinking a current from the feedback node to set the voltage at the fault signaling line to the voltage corresponding to the detected fault condition, the current sunk being dependent upon the detected fault condition.

When fault conditions are detected within multiple of the plurality of electronic fuses, the fault signaling line may be driven to a voltage corresponding to a most severe of the fault conditions.

When multiple fault conditions are detected within one of the plurality of electronic fuses, the fault signaling line may be driven to a voltage corresponding to a most severe of the fault conditions.

When the fault condition is detected within the at least one secondary fuse, the driving of the fault signaling line to the voltage corresponding to the detected fault condition may include: generating a voltage pulse on the fault signaling line by the at least one secondary fuse using a timing circuit within the at least one secondary fuse, the voltage pulse having an amplitude corresponding to the detected fault condition; and latching the voltage on the fault signaling line in response to detection of the voltage pulse on the fault signaling line, at the single primary fuse.

Resetting by the at least one secondary fuse may reset the timing circuit upon a subsequent detection of normal operation of the at least one secondary fuse. Prior to the reset of the timing circuit, the timing circuit may generate no other voltage pulses on the fault signaling line.

The method may further include latching the voltage on the fault signaling line by at the primary fuse, detecting the voltage on the fault signaling line, driving the fault signaling line to the detected voltage, and latching the voltage on the fault signaling line.

Also disclosed herein is an analog power electronic circuit, including: an input node and a voltage node; and a primary fuse configured to conduct current between the input node and the voltage node. The primary fuse may include: a logic circuit configured to generate output indicative of a fault within the analog power electronic circuit and a severity of said fault; a priority encoder configured to receive the output from the logic circuit and to assert one of a plurality of control signals corresponding to the severity of the fault; a plurality of switches, each controlled by a different one of the plurality of control signals to selectively coupled an intermediate node to a voltage corresponding to the severity of the fault; and a current sinking circuit configured to sink sufficient current from a feedback node so as to set the feedback node to the voltage corresponding to the severity of the fault. The analog power electronic circuit may further include: a fault signaling line coupled to the feedback node; and a secondary fuse in parallel with the primary fuse and configured to conduct current between the input node and the voltage node. The secondary fuse may be configured to: detect whether a fault is present within the secondary fuse; and set the fault signaling line with a voltage corresponding to the severity of the fault for a duration of a pulse, in response to detection of the fault present within the secondary fuse.

A controller may be configured to generate a reset signal to reset the priority encoder of the primary fuse to release the latching of the voltage to the fault signaling line.

The primary fuse may also include: a plurality of comparators each configured to compare the voltage at the feedback node to a different threshold comparison voltage; a priority decoder configured to receive output from the plurality of comparators and to assert one of a plurality of fault remediation signals corresponding to a lowest of the threshold comparison voltages that the voltage at the feedback node is less than; and a fault action block configured to modify conduction of the current through the secondary fuse based upon the asserted fault remediation signal.

The primary fuse may further include a fault detection circuit configured to generate output indicative of a fault within the primary fuse and a severity of said fault. The logic circuit may include a plurality of logical OR gates, each logical OR gate performing a logical OR operation on a different respective output of the fault detection circuit and a corresponding fault remediation signal.

The current sinking circuit may be a current sinking buffer.

The secondary fuse may include: a fault detection circuit configured to generate output indicative of a fault within the secondary fuse and a severity of said fault; a timing circuit configured to generate pulses corresponding to those outputs of the fault detection circuit that indicate all but the least severe fault; a priority encoder configured to receive the pulses from the timing circuit and to receive the output of the fault detection circuit that indicates the least severe fault, and to assert one of a plurality of control signals corresponding to a most severe fault indicated by the pulses and the output of the fault detection circuit that indicates the least severe fault; a plurality of switches, each controlled by a different one of the plurality of control signals to selectively coupled an intermediate node to a voltage corresponding to the severity of the fault; and a current sinking circuit configured to sink sufficient current from the feedback node so as to set the feedback node to the voltage corresponding to the severity of the fault.

The secondary fuse may also include: a plurality of comparators each configured to compare the voltage at the feedback node to a different threshold comparison voltage; a priority decoder configured to receive output from the plurality of comparators and to assert one of a plurality of fault remediation signals corresponding to a lowest of the threshold comparison voltages that the voltage at the feedback node is less than; and a fault action block configured to modify conduction of the current through the secondary fuse based upon the asserted fault remediation signal.

Assertion of the fault remediation signal corresponding to the least severe fault may reset the timing circuit.

DETAILED DESCRIPTION

The following disclosure enables a person skilled in the art to make and use the subject matter described herein. The general principles outlined in this disclosure can be applied to embodiments and applications other than those detailed above without departing from the spirit and scope of this disclosure. It is not intended to limit this disclosure to the embodiments shown, but to accord it the widest scope consistent with the principles and features disclosed or suggested herein.

Figure 1:
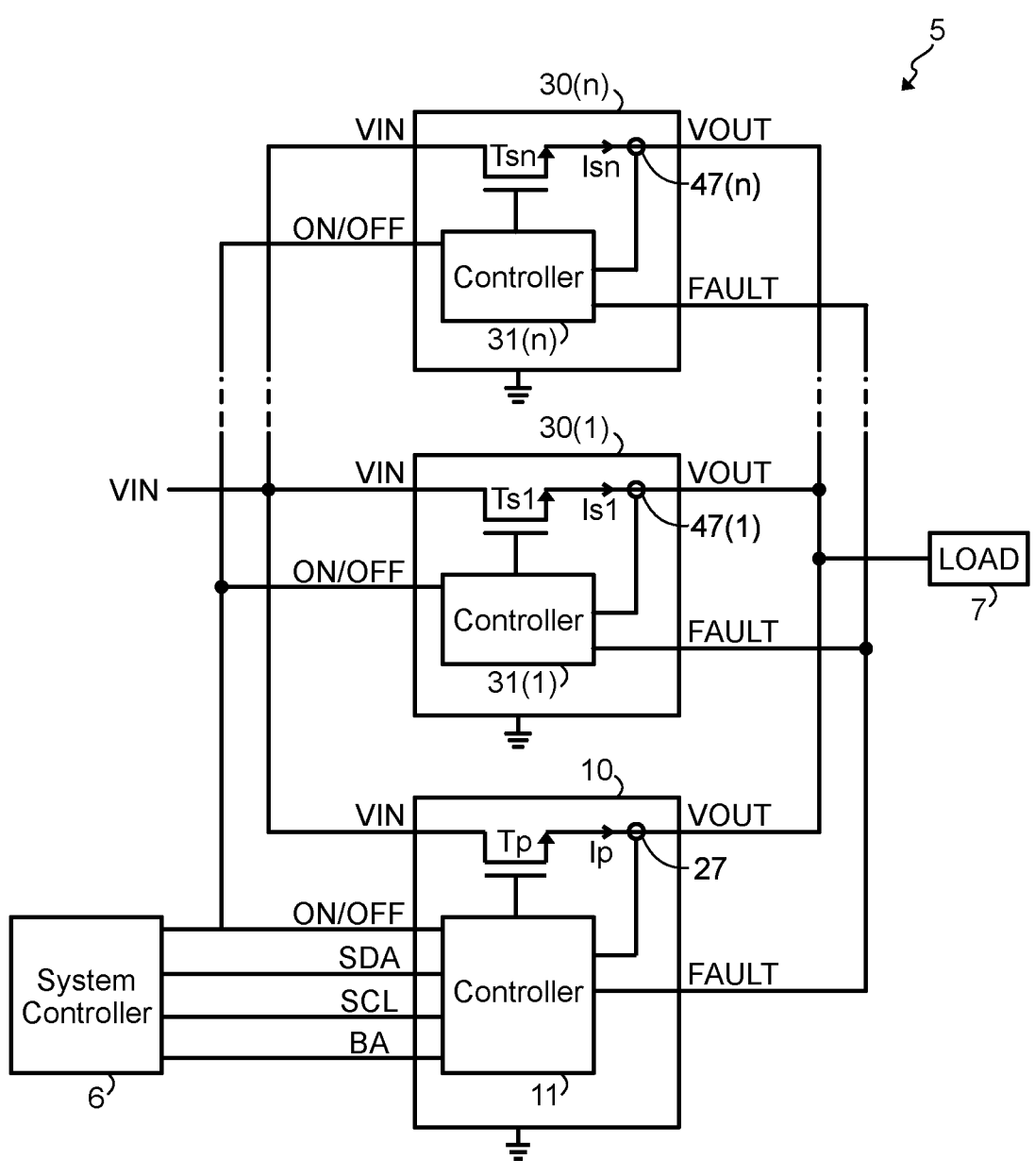
FIG. 1 is a block diagram of an analog power electronic circuit described herein.

Now described with reference to FIG. 1 is an analog power electronic circuit 5 including multiple electronic fuses under control of a system controller 6 and connected in parallel between a supply node (at which an input voltage VIN is present) and a load 7. Multiple such electronic fuses are connected in parallel to increase the total current handling capability. For example, if a higher current is expected to flow between the supply node and the load than is supported by a single electronic fuse, multiple such electronic fuses are connected in parallel to provide for the desired level of current handling. This may also provide for better heat dissipation and distribution. The electronic fuses herein include a single primary fuse 10 and n secondary fuses 30(1), . . . , 30(n), where n is an integer, and therefore there may be any number of secondary fuses 30(1), . . . , 30(n).

The primary fuse 10 includes a controller 11 that receives an ON/OFF signal from the system controller 6 and is in bidirectional communication with the system controller 6 via a data communication bus formed by a serial data line (SDA), serial clock line (SCL), and a bus alert (BA) line. The primary fuse includes an n-channel power transistor Tp having its drain connected to the input voltage VIN, its source connected to the load 7, and its gate controlled by the controller 11. The controller 11 controls the gate of the transistor Tp based upon feedback from the current sensor 27 which senses the drain current Ip of the transistor Tp, the voltage on the fault signaling line FAULT, the state of the ON/OFF signal, and data received via the data communication bus.

Each secondary fuse 30(1), . . . , 30(n) includes an n-channel power transistor Ts1, . . . , Tsn having its drain connected to the input voltage VIN, its source connected to the load 7, and its gate controlled by a respective controller 31(1), . . . , 31(n) based upon feedback from a corresponding current sensor 47(1), . . . , 47(n), the voltage on the fault signaling line FAULT, and the state of the ON/OFF signal.

First, the operation of the analog power electronic circuit 5 will be described in general, and thereafter, specifics of the controllers 11, and 31(1), . . . , 31(n) together with descriptions of their operations will be given.

Beginning the general description now, the fault signaling line FAULT, is connected to the controllers 10 and 31(1), . . . , 31(n) of each fuse 10, and 30(1), . . . , 30(n). Its role is to facilitate communication between the primary fuse 10 and the secondary fuses 30(1), . . . , 30(n), particularly when a fault condition is detected. In the instance of a fault condition occurring within one of the secondary fuses 30(1), . . . , 30(n), the relevant controller 31(1), . . . , 31(n) performs a corrective action. This could be lowering the current passing through the corresponding power transistor Ts1, . . . , Tsn or switching off that power transistor completely. Together with this, the secondary fuse 31(1), . . . , 31(n) experiencing the fault proceeds to sink current from the fault signaling line FAULT for a given period of time, resulting in a change in the voltage on FAULT to alert the other fuses of the fault condition—the voltage on FAULT is pulsed for the given period of time.

Upon detecting this change in voltage on the fault signaling line FAULT, the controller 11 of the primary fuse 10, as well as the controllers 31(1), . . . , 31(n), each perform a corrective action, while the controller 11 of the primary fuse 10 latches this voltage so that it persists longer than the given period of time, essentially preserving the alert of the fault. This latching mechanism persists until reset by the system controller 6.

In the event that the fault condition originated within the primary fuse 10, the controller 11 would initiate the same corrective action procedure. The controller 11 would also in this instance sink current from the fault signaling line FAULT and subsequently voltage value on FAULT, making it visible to the system controller 6 and the secondary fuses 30(1), . . . , 30(n) for detection and appropriate response.

Note that different severities of faults may occur and that the voltage level on the fault signaling line FAULT indicates the severity of the fault experienced by the relevant fuse.

In some instances, multiple of the fuses may be experiencing a fault. In this case, the fault signaling line FAULT indicates the most severe fault due to the design of the controllers 10, and 31(1), . . . , 31(n), and therefore the most severe fault being experienced is given priority (e.g., the controllers 10, and 31(1), . . . , 31(n) act take corrective action in response to the most severe fault being experienced).

Figure 2:
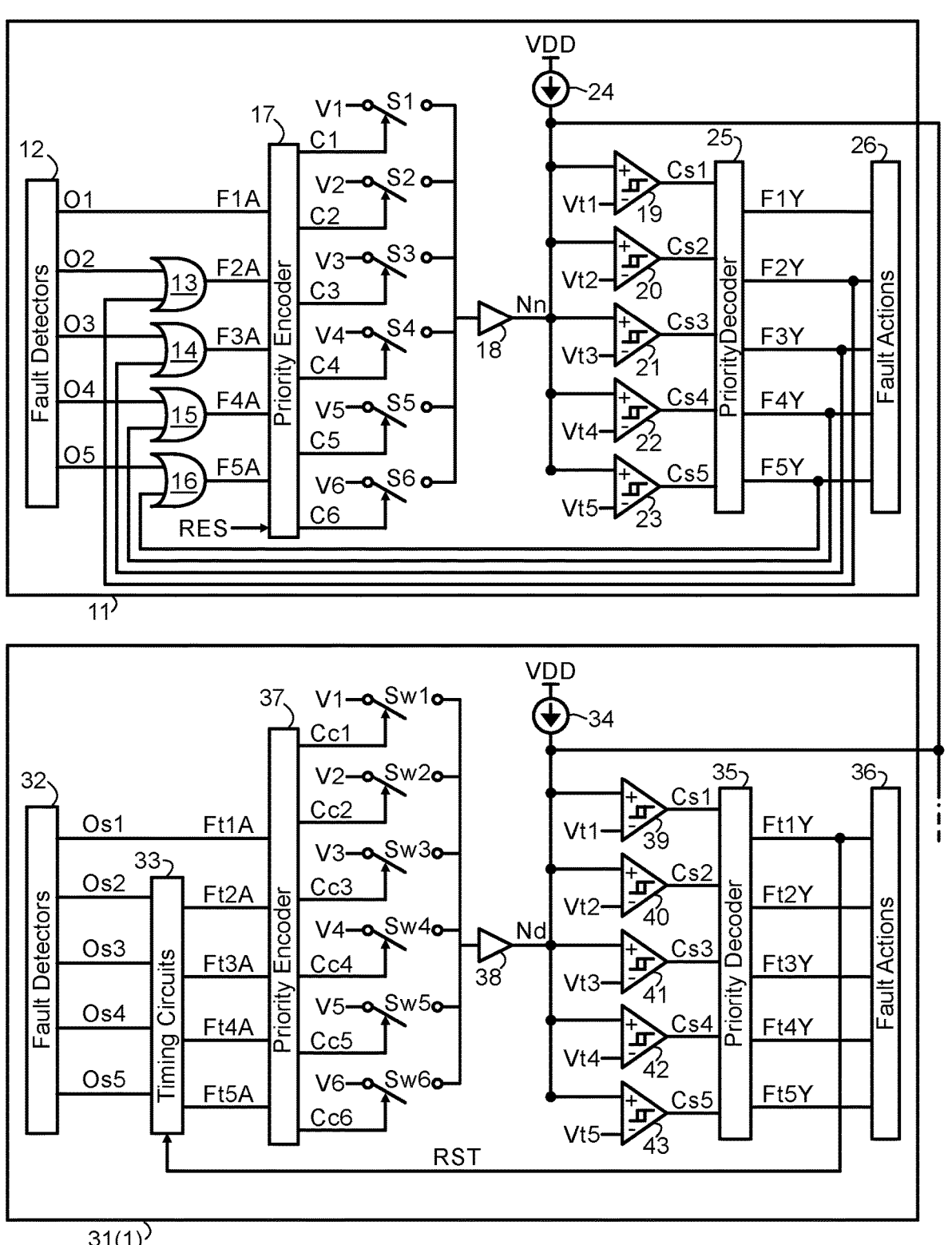
FIG. 2 is a schematic block diagram of the controllers of the primary and secondary fuses of the analog power electronic circuit of FIG. 1.

Refer additionally now to FIG. 2, showing the specifics of the controller 11 of the primary fuse 10, and the controller 31(1) of one of the secondary fuses 30(1), with it being understood that the controllers of each of the other secondary fuses are the same.

The controller 11 includes fault detectors 12 that determine the presence and severity of faults based upon feedback, such as that from the current sensor 27 which senses the drain current Ip of the transistor Tp, the voltage on the fault signaling line FAULT, the state of the ON/OFF signal, and data received via the data communication bus. Other sources of fault indication read by the fault detectors 12 may be an undervoltage protection (UVP) trigger, an overvoltage protection (OVP) trigger, a thermal protection trigger, a MOSFET diagnostic, etc. In this example, five severities of faults may occur, therefore the fault detectors 12 have five outputs O1, O2, O3, O4, O5 with each output being used to indicate a different severity of fault—output O1 is used to indicate the least severe fault, with fault severity increasing from O2 to O5, and output O5 therefore being used to indicate the most severe fault.

An OR gate 13 has a first input connected to the output O2 of the fault detectors 12, a second input connected to the output F2Y of priority decoder 25, and an output at which a fault indication signal F2A is generated. Fault indication signal F2A indicates a fault with the severity indicated by assertion of O2. An OR gate 14 has a first input connected to the output O3 of the fault detectors 12, a second input connected to the output F3Y of priority decoder 25, and an output at which a fault indication signal F3A is generated. Fault indication signal F3A indicates a fault with the severity indicated by assertion of O3. An OR gate 15 has a first input connected to the output O4 of the fault detectors 12, a second input connected to the output F4Y of priority decoder 25, and an output at which a fault indication signal F4A is generated. Fault indication signal F4A indicates a fault with the severity indicated by assertion of O4. An OR gate 16 has a first input connected to the output O5 of the fault detectors 12, a second input connected to the output F5Y of priority decoder 25, and an output at which a fault indication signal F5A is generated. Fault indication signal F5A indicates a fault with the severity indicated by assertion of O5.

A priority encoder 17 receives the fault indication signal F1A from the output O1 of the fault detectors 12, the fault indication signal F2A from the output of OR gate 13, the fault indication signal F3A from the output of OR gate 14, the fault indication signal F4A from the output of OR gate 15, and the fault indication signal F5A from the output of OR gate 16. The priority encoder 17 generates the control signals C1, C2, C3, C4, C5, C6 for controlling actuation of the switches S1, S1, S3, S4, S5, S6.

Switch S1 selectively connects a first voltage V1 to the input of a current sinking buffer 18 in response to assertion of control signal C1. Switch S2 selectively connects a second voltage V2 to the input of the current sinking buffer 18 in response to assertion of control signal C2. Switch S3 selectively connects a third voltage V3 to the input of the current sinking buffer 18 in response to assertion of control signal C3. Switch S4 selectively connects a fourth voltage V4 to the input of the current sinking buffer 18 in response to assertion of control signal C4. Switch S5 selectively connects a fifth voltage V5 to the input of the current sinking buffer 18 in response to assertion of control signal C5. Switch S6 selectively connects a sixth voltage V6 to the input of the current sinking buffer 18 in response to assertion of control signal C6. Voltage V1 (e.g., 3V) is greater than voltage V2 (e.g., 2V), which is greater than voltage V3 (e.g., 1.5V), which is greater than voltage V4 (e.g., 1.0V), which is greater than voltage V5 (e.g., 0.5V), which in turn is greater than voltage V6 (e.g., 0V).

A constant current source 24 sources a constant current to node Nn. The priority encoder 17 asserts the control signal C1 when none of the fault indication signals F1A, F2A, F3A, F4A, F5A are asserted, connecting the input of the current sinking buffer 18 to a voltage V1, resulting in the current sinking buffer 18 sinking sufficient current from its output at node Nn such the voltage at node Nn is set to V1. When one or more of the fault indication signals F1A, F2A, F3A, F4A, F5A are asserted, the priority encoder 17 asserts a corresponding one of the control signals C2, C3, C4, C5, C6—when F1A is asserted, the priority encoder 17 asserts control signal C2 to set the voltage at node Nn to voltage V2; when F2A is asserted, the priority encoder 17 asserts control signal C3 to set the voltage at node Nn to voltage V3; when F3A is asserted, the priority encoder 17 asserts control signal C4 to set the voltage at node Nn to voltage V4; when F4A is asserted, the priority encoder 17 asserts control signal C5 to set the voltage at node Nn to voltage V5; and when F5A is asserted, the priority encoder 17 asserts control signal C6 to set the voltage at node Nn to voltage V6.

The lower the voltage level to which node Nn is set, the higher the severity of the fault that has occurred. A chart showing an example mapping of specific fault types to voltages may be seen below:

| Voltage Level of Nn | Fault | Latched? | Severity |
|---|---|---|---|
| V1 | No fault | No | None |
| V2 | VIN transient event | No | Lowest |
| V3 | UVLO or OVLO | Yes | ↓ |
| V4 | Overload | Yes | |
| V5 | Overtemperature | Yes | |
| V6 | Diagnostic failure | Yes | Highest |

Only one of the control signals C1, C2, C3, C4, C5 may be asserted at a time. When multiple of the fault indication signals F1A, F2A, F3A, F4A, F5A are asserted, the fault indication representing the most severe fault (highest priority) is acted upon by the priority encoder 17. For example, if F2A and F4A are both asserted, the priority encoder 17 asserts the control signal C5 to connect the voltage V4 to the input of the current sinking buffer 18 because assertion of fault indication signal F4A represents a more severe fault than assertion of fault indication signal F2A.

A first hysteretic comparator 19 has its inverting input terminal connected to a first threshold comparison voltage Vt1, its non-inverting input terminal connected to node Nn, and an output at which a comparison signal Cs1 is generated. A second hysteretic comparator 20 has its inverting input terminal connected to a second threshold comparison voltage Vt2, its non-inverting input terminal connected to node Nn, and an output at which a comparison signal Cs2 is generated. A third hysteretic comparator 21 has its inverting input terminal connected to a third threshold comparison voltage Vt3, its non-inverting input terminal connected to node Nn, and an output at which a comparison signal Cs3 is generated. A fourth hysteretic comparator 22 has its inverting input terminal connected to a fourth threshold comparison voltage Vt4, its non-inverting input terminal connected to node Nn, and an output at which a comparison signal Cs4 is generated. A fifth hysteretic comparator 23 has its inverting input terminal connected to a fifth threshold comparison voltage Vt5, its non-inverting input terminal connected to node Nn, and an output at which a comparison signal Cs5 is generated.

First threshold comparison voltage Vt1 (e.g., 2.25V) is greater than second threshold comparison voltage Vt2 (e.g., 1.75V), which is greater than third threshold comparison voltage Vt3 (e.g., 1.25V), which is greater than fourth threshold comparison voltage Vt4 (e.g., 0.75V), which is in turn is greater than fifth threshold comparison voltage Vt5 (e.g., 0.25V).

The priority decoder 25 receives the comparison signals Cs1, Cs2, Cs3, Cs4, Cs5 as input and, when at least one of those comparison signals is asserted, asserts a corresponding highest priority one of the output signals F1Y, F2Y, F3Y, F4Y, F5Y. Therefore, output signal F1Y being asserted is indicative of comparison signal Cs1 being asserted (indicating that the fault indication signal F1A is the most severe fault being indicated by the fault detectors 12), output signal F2Y being asserted is indicative of comparison signal Cs2 being asserted (indicating that the fault indication signal F2A is the most severe fault being indicated by the fault detectors 12), output signal F3Y being asserted is indicative of comparison signal Cs3 being asserted (indicating that the fault indication signal F3A is the most severe fault being indicated by the fault detectors 12), output signal F4Y being asserted is indicative of comparison signal Cs4 being asserted (indicating that the fault indication signal F4A is the most severe fault being indicated by the fault detectors 12), and output signal F5Y being asserted is indicative of comparison signal Cs5 being asserted (indicating that the fault indication signal F5A is the most severe fault being indicated by the fault detectors 12).

The fault action block 26 takes corrective actions that are dependent upon which output signal F1Y, F2Y, F3Y, F4Y, F5Y is asserted. These corrective actions may be, for example, turning off the transistor Tp, modulating the gate voltage of transistor Tp, etc.

In operation, the hysteretic comparators 19, 20, 21, 22, 23 each compare the voltage at node Nn to their respective threshold comparison voltages Vt1, Vt2, Vt3, Vt4, Vt5 and assert their outputs to produce corresponding comparison signals Cs1, Cs2, Cs4, Cs4, Cs5 when the voltage at node Nn is greater than those respective comparison threshold voltages Vt1, Vt2, Vt3, Vt4, Vt5 by the upper hysteresis threshold. The priority decoder 25 receives the comparison signals Cs1, Cs2, Cs3, Cs4, Cs5 as input and, when at least one of those comparison signals is asserted, asserts a corresponding highest priority one of the output signals F1Y, F2Y, F3Y, F4Y, F5Y and the fault action block takes corrective action based thereupon. The OR gates 13, 14, 15, 16 perform a logical OR operation between the signals on the outputs O2, O3, O4, O5 from fault detectors 12 and the output signals F2Y, F3Y, F4Y, F5Y and produce the fault indication signals F2A, F3A, F4A, F5A as the result. The priority encoder 17 receives the fault indication signals F1A, F2A, F3A, F4A, F5A as input and, when at least one of those fault indication signals is asserted, asserts one of the control signals C2, C3, C4, C5, C6 corresponding to a highest priority one of the fault indication signals F1A, F2A, F3A, F4A, F5A to thereby close the associated switch S2, S3, S4, S5, S6, and latches this control signal. As a result, the voltage V2, V3, V4, V5, V6 associated with the closed switch is present at the input to the current sinking buffer 18, causing the current sinking buffer 18 to sink sufficient current from node Nin to set the voltage at that node to the voltage associated with the closed switch. If and when a reset signal RES is asserted (which may be periodically asserted by the system controller 6, or may be asserted by the system controller 6 in response to other conditions or received commands), the priority encoder 17 releases the latched control signal C2, C3, C4, C5, C6. If the same highest priority fault remains, the same corresponding fault indication signal F1A, F2A, F3A, F4A, F5A will be reasserted, and, if that fault indication signal is F2A, F3A, F4A, F5A, it is asserted regardless of whether the fault was detected by the fault detectors 12 of the primary fuse 10 or by the fault detectors 32 of one of the secondary fuses 30(1), . . . , 30(n).

Note that if none of the fault indication signals F1A, F2A, F3A, F4A, F5A are asserted, the priority encoder 17 asserts the control signal C1 but does not latch it—once one of the fault indication signals F1A, F2A, F3A, F4A, F5A is asserted, the priority encoder 17 responds as described above. Therefore, the voltage at node Nn remains at voltage V1 unless and until one of the fault indication signals F1A, F2A, F3A, F4A, F5A is asserted in either the primary fuse 11 or one of the secondary fuses 31(1), . . . , 31(n).

The controller 31(1) includes fault detectors 32 that determine the presence and severity of faults based upon feedback from the current sensor 47(1) which senses the drain current Is1 of the transistor Ts1, the voltage on the fault signaling line FAULT, and the state of the ON/OFF signal. In this example, five severities of faults may occur, therefore the fault detectors 32 have five outputs Os1, Os2, Os3, Os4, Os5 with each output being used to indicate a different severity of fault—output Os1 is used to indicate the least severe fault, with fault severity increasing from Os2 to Os5, and output Os5 therefore being used to indicate the most severe fault.

Timing circuits 33 have inputs connected to the outputs Os2, Os3, Os4, Os5 of the fault detectors 32 and generate relevant fault indication pulses Ft2A, Ft3A, Ft4A, Ft5A at corresponding outputs in response to assertions of the outputs Os2, Os3, Os4, Os5 of the fault detectors 32. In particular, when output Os2 is asserted, the timing circuits 33 generate a fault indication pulse Ft2A, when output Os3 is asserted, the timing circuits 33 generate a fault indication pulse Ft3A, when output Os4 is asserted, the timing circuits 33 generate a fault indication pulse Ft4A, and when output Os5 is asserted, the timing circuits 33 generate a fault indication pulse Ft5a.

A priority encoder 37 receives a fault indication signal Ft1A (which is not a pulse but instead remains at a logic low in the absence of an error but is asserted to a logic high when the lowest priority error occurs) from the output Os1 of the fault detectors 32, and the fault indication signals Ft2A, Ft3A, Ft4A, Ft5A from the timing circuits 33. The priority encoder 37 generates the control signals Cc1, Cc2, Cc3, Cc4, Cc5, Cc6 for switches Sw1, Sw1, Sw3, Sw4, Sw5, Sw6 in response to the state of Ft1A and in response to pulses of Ft2A, Ft3A, Ft4A, and Ft5A.

Switch Sw1 selectively connects a first voltage V1 to the input of a current sinking buffer 38 in response to assertion of control signal Cc1. Switch Sw2 selectively connects a second voltage V2 to the input of the current sinking buffer 38 in response to assertion of control signal Cc2. Switch Sw3 selectively connects a third voltage V3 to the input of the current sinking buffer 38 in response to assertion of control signal Cc3. Switch Sw4 selectively connects a fourth voltage V4 to the input of the current sinking buffer 38 in response to assertion of control signal Cc4. Switch Sw5 selectively connects a fifth voltage V5 to the input of the current sinking buffer 38 in response to assertion of control signal Cc5. Switch Sw6 selectively connects a sixth voltage V6 to the input of the current sinking buffer 38 in response to assertion of control signal Cc6. Voltage V1 (e.g., 3V) is greater than voltage V2 (e.g., 2V), which is greater than voltage V3 (e.g., 1.5V), which is greater than voltage V4 (e.g., 1.0V), which is greater than voltage V5 (e.g., 0.5V), which in turn is greater than voltage V6 (e.g., 0V).

A constant current source 34 sources a constant current to node Nd. The priority encoder 37 asserts the control signal Cc1 when the fault indication signals Ft1A is deasserted and in the absence of a pulse of Ft2A, Ft3A, Ft4A, Ft5A, connecting the input of the current sinking buffer 38 to a voltage V1, resulting in the current sinking buffer 38 sinking sufficient current from its output at node Nd such the voltage at node Nd is set to V1. When the fault indication signal Ft1A is asserted or a pulse of Ft2A, Ft3A, Ft4A, Ft5A arrives, the priority encoder 37 asserts a corresponding one of the control signals Cc2, Cc3, Cc4, Cc5, Cc6—when Ft1A is asserted, the priority encoder 37 asserts control signal Cc2 to set the voltage at node Nd to voltage V2; when Ft2A is pulsed, the priority encoder 37 asserts control signal Cc3 to set the voltage at node Nd to voltage V3 for the duration of the pulse; when Ft3A is pulsed, the priority encoder 37 asserts control signal Cc4 to set the voltage at node Nd to voltage V4 for the duration of the pulse; when Ft4A is asserted, the priority encoder 37 asserts control signal Cc5 to set the voltage at node Nd to voltage V5 for the duration of the pulse; and when Ft5A is asserted, the priority encoder 37 asserts control signal Cc6 to set the voltage at node Nd to voltage V6 for the duration of the pulse.

Only one of the control signals Cc1, Cc2, Cc3, Cc4, Cc5 may be asserted at a time. When multiple of the fault indication signals Ft1A, Ft2A, Ft3A, Ft4A, Ft5A are asserted/pulsed, the fault indication representing the most severe fault (highest priority) is acted upon by the priority encoder 37. For example, if Ft2A and Ft4A are both pulses, the priority encoder 37 asserts the control signal Cc5 to connect the voltage V4 to the input of the current sinking buffer 38 for the length of the pulse because assertion of fault indication signal Ft4A represents a more severe fault than assertion of fault indication signal Ft2A.

The lower the voltage level to which node Nd is set, the higher the severity of the fault that has occurred. A chart showing an example mapping of specific fault types to voltages may be seen below:

| Voltage Level of Nn | Fault | Latched? | Severity |
|---|---|---|---|
| V1 | No fault | No | None |
| V2 | VIN transient event | No | Lowest |
| V3 | UVLO or OVLO | Yes | ↓ |
| V4 | Overload | Yes | |
| V5 | Overtemperature | Yes | |
| V6 | Diagnostic failure | Yes | Highest |

A first hysteretic comparator 39 has its inverting input terminal connected to a first threshold comparison voltage Vt1, its non-inverting input terminal connected to node Nd, and an output at which a comparison signal Cs1 is generated. A second hysteretic comparator 40 has its inverting input terminal connected to a second threshold comparison voltage Vt2, its non-inverting input terminal connected to node Nd, and an output at which a comparison signal Cs2 is generated. A third hysteretic comparator 41 has its inverting input terminal connected to a third threshold comparison voltage Vt3, its non-inverting input terminal connected to node Nd, and an output at which a comparison signal Cs3 is generated. A fourth hysteretic comparator 42 has its inverting input terminal connected to a fourth threshold comparison voltage Vt4, its non-inverting input terminal connected to node Nd, and an output at which a comparison signal Cs4 is generated. A fifth hysteretic comparator 43 has its inverting input terminal connected to a fifth threshold comparison voltage Vt5, its non-inverting input terminal connected to node Nd, and an output at which a comparison signal Cs5 is generated.

First threshold comparison voltage Vt1 (e.g., 2.25V) is greater than second threshold comparison voltage Vt2 (e.g., 1.75V), which is greater than third threshold comparison voltage Vt3 (e.g., 1.25V), which is greater than fourth threshold comparison voltage Vt4 (e.g., 0.75V), which is in turn is greater than fifth threshold comparison voltage Vt5 (e.g., 0.25V).

The priority decoder 35 receives the comparison signals Cs1, Cs2, Cs3, Cs4, Cs5 as input and, when at least one of those comparison signals is asserted, asserts a corresponding highest priority one of the output signals Ft1Y, Ft2Y, Ft3Y, Ft4Y, Ft5Y. Therefore, output signal Ft1Y being asserted is indicative of comparison signal Cs1 being asserted (indicating that the fault indication signal Ft1A is the most severe fault being indicated by the fault detectors 32), output signal Ft2Y being asserted is indicative of comparison signal Cs2 being asserted (indicating that the fault indication signal Ft2A is the most severe fault being indicated by the fault detectors 32), output signal Ft3Y being asserted is indicative of comparison signal Cs3 being asserted (indicating that the fault indication signal Ft3A is the most severe fault being indicated by the fault detectors 32), output signal Ft4Y being asserted is indicative of comparison signal Cs4 being asserted (indicating that the fault indication signal Ft4A is the most severe fault being indicated by the fault detectors 32), and output signal Ft5Y being asserted is indicative of comparison signal Cs5 being asserted (indicating that the fault indication signal Ft5A is the most severe fault being indicated by the fault detectors 32).

The fault action block 26 takes corrective actions that are dependent upon which output signal Ft1Y, Ft2Y, Ft3Y, Ft4Y, Ft5Y is asserted. These corrective actions may be, for example, turning off the transistor Ts1, modulating the gate voltage of transistor Ts1, etc.

In operation, the timing circuits 33 are connected to receive the outputs Os2, Os3, Os4, Os5 and generate pulses of Ft2A, Ft3A, Ft4A, Ft5A at a same given duration and corresponding to which of the outputs Os2, Os3, Os4, Os5 are asserted.

The priority encoder 37 receives the fault indication signals/pulses Ft1A, Ft2A, Ft3A, Ft4A, Ft5A as input and, when at least one of those fault indication signals is asserted/pulsed, asserts one of the control signals Cc2, Cc3, Cc4, Cc5, Cc6 corresponding to a highest priority one of the fault indication signals Ft1A, Ft2A, Ft3A, Ft4A, Ft5A to thereby close the associated switch Sw2, Sw3, Sw4, Sw5, Sw6. As a result, the voltage V2, V3, V4, V5, V6 associated with the closed switch is present at the input to the current sinking buffer 38, causing the current sinking buffer 38 to sink sufficient current from node Nd to set the voltage at that node to the voltage associated with the closed switch. The primary fuse 10 then acts as described above to latch that voltage until reset.

When none of the fault indication signals/pulses Ft1A, Ft2A, Ft3A, Ft4A, Ft5A is asserted, the priority encoder asserts the control signal Cc1, closing switch Sw1, connecting the input of the current sinking buffer 38 to voltage V1, setting the voltage at node Nd to voltage V1.

The hysteretic comparators 39, 40, 41, 42, 43 each compare the voltage at node Nd to their respective threshold comparison voltages Vt1, Vt2, Vt3, Vt4, Vt5 and assert their outputs to produce corresponding comparison signals Cs1, Cs2, Cs4, Cs4, Cs5 when the voltage at node Nd is greater than those respective comparison threshold voltages Vt1, Vt2, Vt3, Vt4, Vt5 by the upper hysteresis threshold. The priority decoder 35 receives the comparison signals Cs1, Cs2, Cs3, Cs4, Cs5 as input and, when at least one of those comparison signals is asserted, asserts a corresponding highest priority one of the output signals Ft1Y, Ft2Y, Ft3Y, Ft4Y, Ft5Y and the fault action block takes corrective action based thereupon.

When the priority decoder 35 asserts the output signal Ft1Y, the timing circuits 33 are reset, allowing the generation of a new pulse of Ft2A, Ft3A, Ft4A, Ft5A in response to assertion of respective inputs Os2, Os3, Os4, Os5. Therefore, if the same highest priority fault persists, another corresponding pulse of Ft2A, Ft3A, Ft4A, Ft5A is generated.

An example iteration is now described with reference to FIG. 3. Initially, neither the primary fuse 10 or secondary fuses 30(1), . . . , 30(n) are experiencing a fault, therefore their respective fault detectors 12 and 32 do not assert their outputs O1, O2, O3, O4, O5 and Os1, Os2, Os3, Os4, Os5. Thereafter, a fault is detected by the fault detector 32 of one of the secondary fuses 30(1), . . . , 30(n), shown by the transitioning of the fault event in FIG. 3, ultimately resulting in the buffer 38 driving the fault signaling line FAULT by the secondary device to the appropriate voltage level to indicate the specific fault occurring—this is shown by arrow 1. This voltage level is then latched by the primary fuse 10—this is shown by arrow 2. The actual voltage on the fault signaling line FAULT drops to indicate the fault that has occurred—this is shown by arrow 3.

Figure 3:
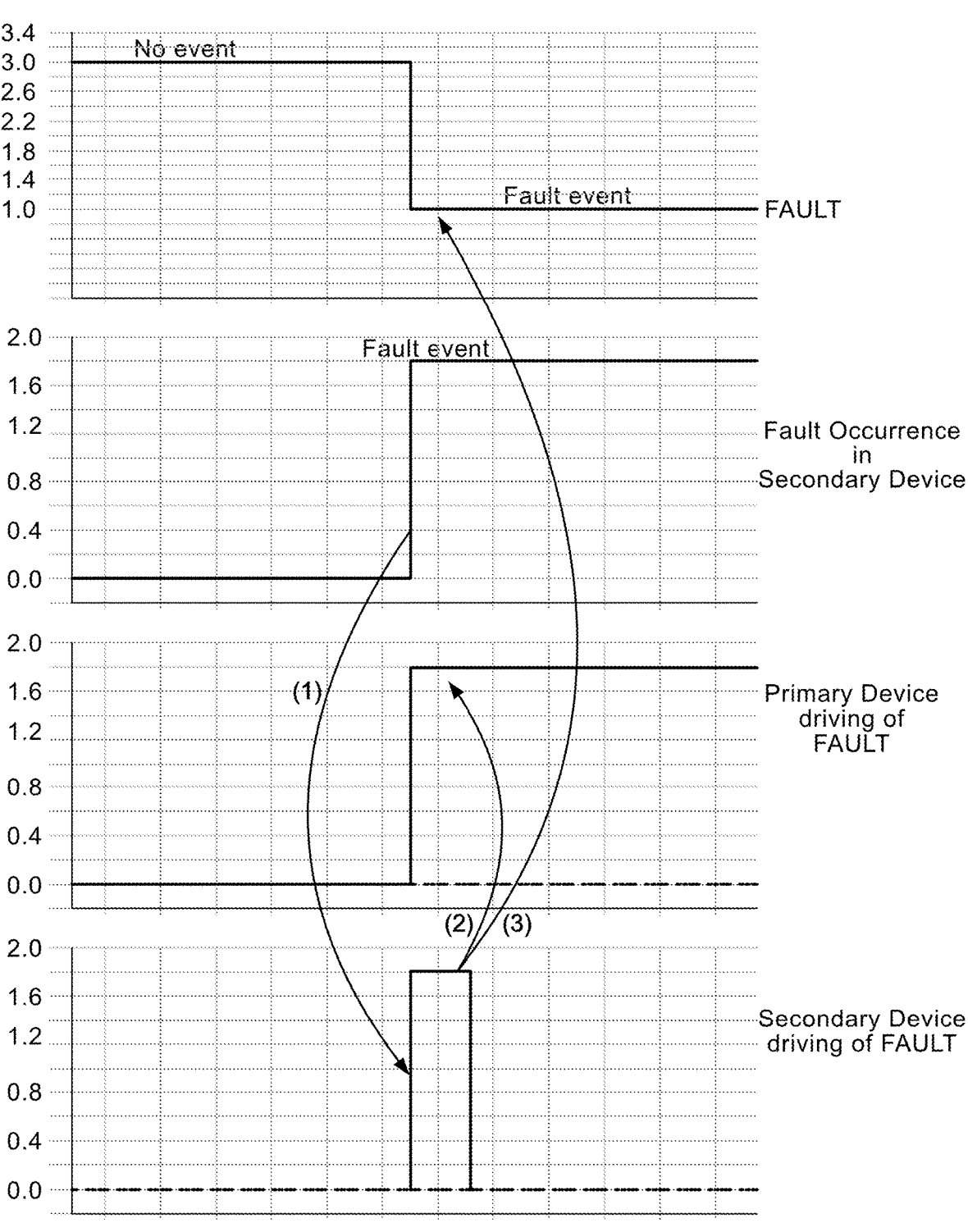
FIGS. 3-4 are graphs of voltage values of the primary and secondary fuses of FIG. 2 during operation.
Figure 4:
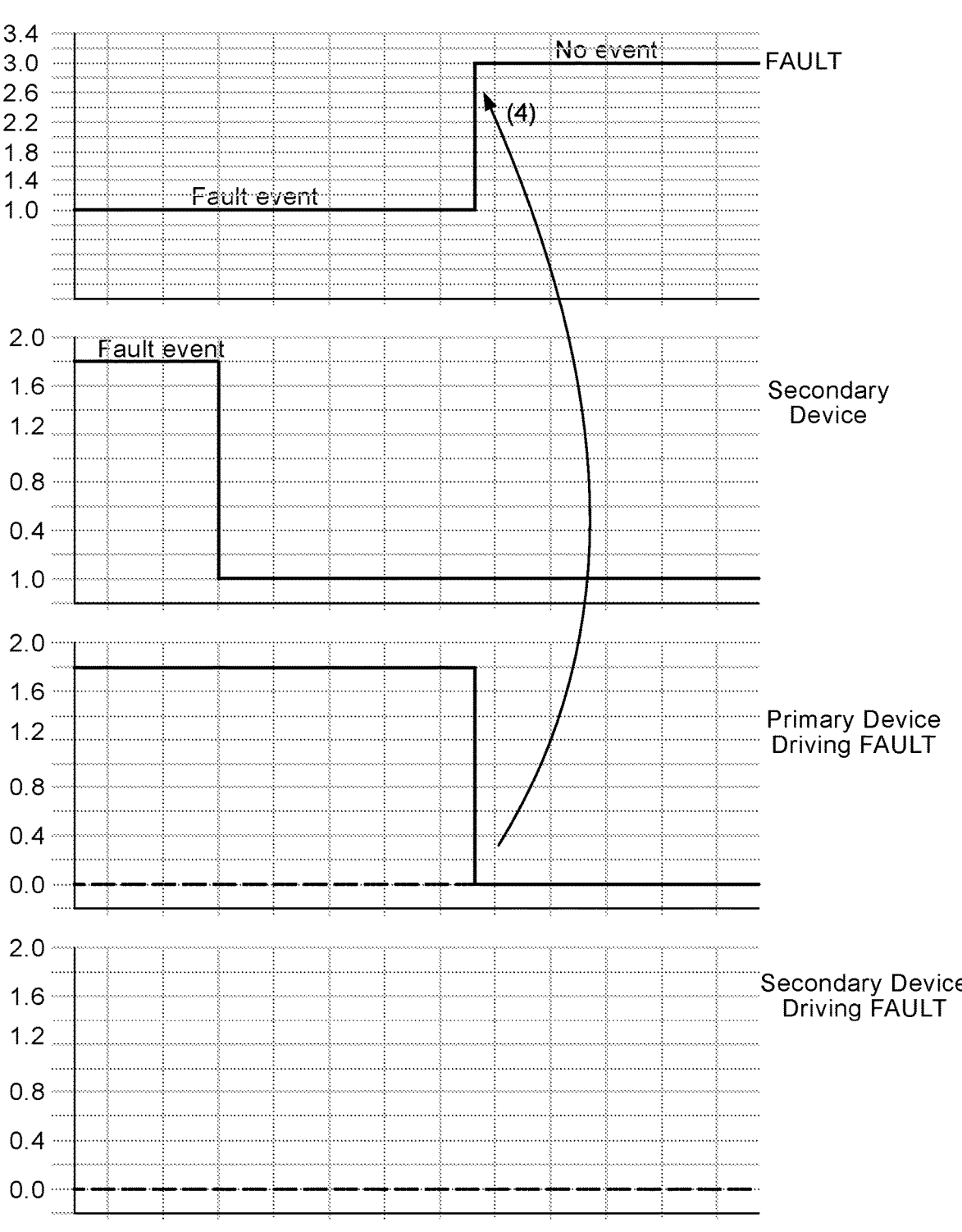

In response to the fault detection by the fault detector 32, the fault action block 36 takes action and therefore the fault in the secondary fuse ends, shown as the ending of the pulse in FIG. 3 indicating the secondary fuse driving of FAULT. Next, the reset signal RST is asserted, causing the priority encoder 17 to reset, ending the driving of FAULT by the primary fuse, as shown in FIG. 4. As a result, the voltage on FAULT returns to its idle value, shown by arrow 4.

The advantages provided by the analog power electronic circuit 5 including the primary fuse 10 and secondary fuse 31(1), . . . , 31(n) designs described above are numerous.

For example, the multi-voltage level communication via a single fault signaling line allows different fault severity levels to be communicated using that single line, leading to precise and appropriate responses without the need for additional signaling lines that consume area. Also, the latching and preservation of the fault indication on the fault signaling line until it is reset reduces the risk of cascading failures by giving each fuse time to react.

Finally, it is evident that modifications and variations can be made to what has been described and illustrated herein without departing from the scope of this disclosure.

Although this disclosure has been described with a limited number of embodiments, those skilled in the art, having the benefit of this disclosure, can envision other embodiments that do not deviate from the disclosed scope. Furthermore, skilled persons can envision embodiments that represent various combinations of the embodiments disclosed herein made in various ways.

The invention claimed is:

1. An analog power electronic circuit, comprising:

an input node and a voltage node;

a primary fuse configured to conduct a first current between the input node and the voltage node, the primary fuse comprising:

a logic circuit configured to generate an output indicative of a fault within the analog power electronic circuit and a severity of said fault;

a priority encoder configured to receive the output from the logic circuit and to assert one of a plurality of control signals corresponding to the severity of the fault;

a plurality of switches, wherein each switch is controlled by a different one of the plurality of control signals to selectively couple an intermediate node to a voltage corresponding to the severity of the fault; and a current sinking circuit configured to sink sufficient current from a feedback node so as to set the feedback node to the voltage corresponding to the severity of the fault;

a fault signaling line coupled to the feedback node; and a secondary fuse in parallel with the primary fuse and configured to conduct a second current between the input node and the voltage node, wherein the secondary fuse is configured to:

detect whether a fault is present within the secondary fuse; and set the fault signaling line with a voltage corresponding to the severity of the fault for a duration of a pulse, in response to detection of the fault present within the secondary fuse.

2. The analog power electronic circuit of claim 1, further comprising a controller configured to generate a reset signal to reset the priority encoder of the primary fuse.

3. The analog power electronic circuit of claim 1, wherein the primary fuse further comprises:

a plurality of comparators, wherein each comparator is configured to compare the voltage at the feedback node to a different threshold comparison voltage;

a priority decoder configured to receive output from the plurality of comparators and to assert one of a plurality of fault remediation signals corresponding to a lowest of the threshold comparison voltages that the voltage at the feedback node is less than; and a fault action block configured to modify conduction of the second current through the secondary fuse based upon the asserted fault remediation signal.

4. The analog power electronic circuit of claim 3, wherein the logic circuit comprises a plurality of logical OR gates, each logical OR gate performing a logical OR operation on a different respective output of the fault detection circuit and a corresponding fault remediation signal.

5. The analog power electronic circuit of claim 1, wherein the current sinking circuit comprises a current sinking buffer.

6. The analog power electronic circuit of claim 1, wherein the secondary fuse comprises:

a timing circuit configured to generate pulses corresponding to those outputs of the fault detection circuit that indicate all but the least severe fault;

a priority encoder configured to receive the pulses from the timing circuit and to receive the output of the fault detection circuit that indicates the least severe fault, and to assert one of a plurality of control signals corresponding to a most severe fault indicated by the pulses and the output of the fault detection circuit that indicates the least severe fault;

a plurality of switches, wherein each switch is controlled by a different one of the plurality of control signals to selectively coupled an intermediate node to a voltage corresponding to the severity of the fault; and a current sinking circuit configured to sink sufficient current from the feedback node so as to set the feedback node to the voltage corresponding to the severity of the fault.

7. The analog power electronic circuit of claim 6, wherein the secondary fuse further comprises:

a plurality of comparators each configured to compare the voltage at the feedback node to a different threshold comparison voltage;

a priority decoder configured to receive an output from the plurality of comparators and to assert one of a plurality of fault remediation signals corresponding to a lowest of the threshold comparison voltages that the voltage at the feedback node is less than; and

14 a fault action block configured to modify conduction of the second current through the secondary fuse based upon the asserted fault remediation signal.

8. The analog power electronic circuit of claim 7, wherein assertion of the fault remediation signal corresponding to the least severe fault resets the timing circuit.

9. An analog power electronic circuit, comprising:

a primary fuse configured to conduct a first current between an input node and a voltage node, the primary fuse comprising:

a priority encoder configured to receive a fault indication and to assert one of a plurality of control signals corresponding to the severity of the fault indicated by the fault indication;

a plurality of switches configured to selectively couple an intermediate node to a voltage corresponding to the severity of the fault; and a current sinking circuit configured to sink sufficient current from a feedback node so as to set the feedback node to the voltage corresponding to the severity of the fault;

a fault signaling line coupled to the feedback node;

a secondary fuse in parallel with the primary fuse and configured to conduct a second current between the input node and the voltage node, the secondary fuse configured to:

detect whether a fault is present within the secondary fuse; and set the fault signaling line with a voltage corresponding to the severity of the fault for a duration of a pulse, in response to detection of the fault present within the secondary fuse.

10. The analog power electronic circuit of claim 9, further comprising a controller configured to generate a reset signal to reset the priority encoder of the primary fuse.

11. The analog power electronic circuit of claim 9, wherein the primary fuse further comprises:

a plurality of comparators, wherein each comparator is configured to compare the voltage at the feedback node to a different threshold comparison voltage;

a priority decoder configured to receive an output from the plurality of comparators and to assert one of a plurality of fault remediation signals corresponding to a lowest of the threshold comparison voltages that the voltage at the feedback node is less than; and a fault action block configured to modify conduction of the current through the secondary fuse based upon the asserted fault remediation signal.

12. The analog power electronic circuit of claim 11, wherein the primary fuse further comprises a fault detection circuit configured to generate an output indicative of a fault within the primary fuse and a severity of said fault.

13. The analog power electronic circuit of claim 9, wherein the secondary fuse comprises:

a fault detection circuit configured to generate an output indicative of a fault within the secondary fuse and a severity of said fault;

a timing circuit configured to generate pulses corresponding to those outputs of the fault detection circuit that indicate all but the least severe fault;

a priority encoder configured to receive the pulses from the timing circuit and to receive the output of the fault detection circuit that indicates the least severe fault, and to assert one of a plurality of control signals corresponding to a most severe fault indicated by the pulses and the output of the fault detection circuit that indicates the least severe fault;

a plurality of switches, wherein each switch is controlled by a different one of the plurality of control signals to selectively coupled an intermediate node to a voltage corresponding to the severity of the fault;

a current sinking circuit configured to sink sufficient current from the feedback node so as to set the feedback node to the voltage corresponding to the severity of the fault;

a plurality of comparators, wherein each comparator is configured to compare the voltage at the feedback node to a different threshold comparison voltage;

a priority decoder configured to receive output from the plurality of comparators and to assert one of a plurality of fault remediation signals corresponding to a lowest of the threshold comparison voltages that the voltage at the feedback node is less than; and a fault action block configured to modify conduction of the current through the secondary fuse based upon the asserted fault remediation signal.

* * * * *